US005834809A

United States Patent [19]

Kato et al.

[11] Patent Number: 5,834,809

[45] Date of Patent: Nov. 10, 1998

[54] MIS TRANSISTOR SEMICONDUCTOR DEVICE

[75] Inventors: Yuichi Kato; Yoshikazu Kojima, both of Chiba, Japan

[73] Assignee: Seiko Instruments Inc., Japan

[21] Appl. No.: 568,537

[22] Filed: Dec. 7, 1995

[30] Foreign Application Priority Data

| | | | |
|---|---|---|---|
| Dec. 9, 1994 | [JP] | Japan | 6-306624 |
| Aug. 24, 1995 | [JP] | Japan | 7-215616 |

[51] Int. Cl.[6] .......... H01L 29/76; H01L 29/94

[52] U.S. Cl. .......... 257/335; 257/333; 257/335; 257/334; 257/326

[58] Field of Search .......... 257/368, 387, 257/388, 335, 334, 326, 337, 338, 213, 333, 389

[56] References Cited

U.S. PATENT DOCUMENTS

| | | | |
|---|---|---|---|
| 5,146,291 | 9/1992 | Watabe et al. | 257/389 |
| 5,168,335 | 12/1992 | D'Arrigo et al. | 257/389 |

*Primary Examiner*—Carl W. Whitehead
*Attorney, Agent, or Firm*—Adams & Wilks

[57] ABSTRACT

A MIS transistor comprises a semiconductor substrate having a first conductivity type, a source region and a drain region disposed in the semiconductor substrate in spaced-apart relation from one another and having a second conductivity type, and an insulating film disposed on the surface of the semiconductor substrate. A gate electrode is disposed on the insulating film between the source region and the drain region. A diffused region having the first conductivity type is disposed in the semiconductor substrate and in contact with the source region. An oxide film is disposed on the diffused region.

10 Claims, 6 Drawing Sheets

F I G. 5A
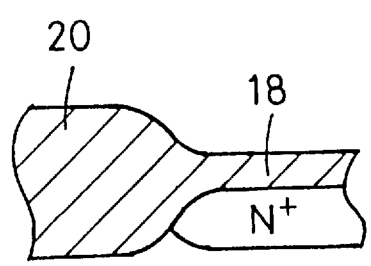
F I G. 5B
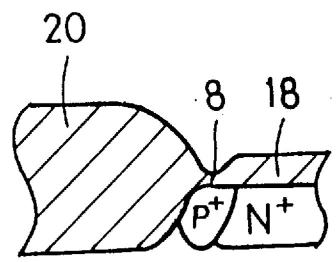
F I G. 6
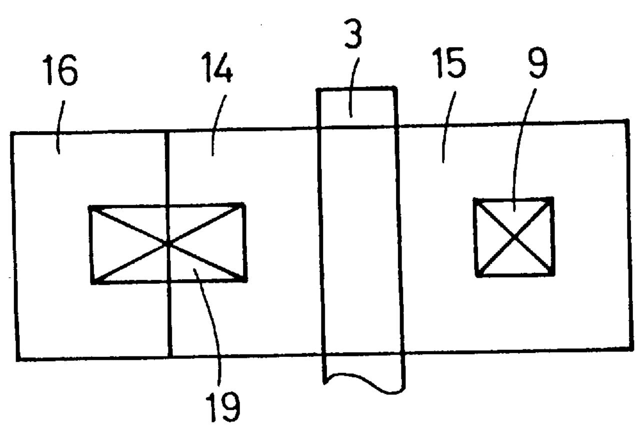

MIS TRANSISTOR SEMICONDUCTOR DEVICE

BACKGROUND OF THE INVENTION

The present invention relates to MIS transistors used in electric devices such as computers and also to a CMOS integrated circuit having transistors of different conductivity types on the same substrate. Furthermore, the invention relates to a method of fabricating such a CMOS integrated circuit.

Prior art MIS transistors and the method of fabricating them are illustrated in FIG. 2. FIG. 2D is a cross-sectional view of the prior art transistors. A gate-insulating film 2 is formed on the surface of an N-type semiconductor substrate 1 and on the surface of a P-type semiconductor substrate 11. Gate electrodes 3 are formed on the film 2. A P-type source 4, a P-type drain 5, an N-type source 14, and an N-type drain 15 are formed close to the surfaces of the semiconductor substrates 1 and 11 adjacently to the gate electrodes 3. An N-type diffused layer 6 and a P-type diffused layer 16 are formed close to them. In the prior art MIS transistors, the P-type source 4, the P-type drain 5, and the P-type diffused layer 16, are substantially flush with the surfaces of the N-type source 14, the N-type drain 15, and the N-type diffused layer 6.

A fabrication method is next described. The gate-insulating film 2 is formed on the surfaces of the N-type semiconductor substrates 1 and the P-type semiconductor substrate 11. The gate electrodes 3 are formed on the film 2 (FIG. 2A). A photoresist 7 is applied. Thereafter, a photolithography step is performed so that windows are formed in the N-type source 14, the N-type drain 15, and the N-type diffused layer 6. An N-type impurity is introduced by ion implantation (FIG. 2B). Subsequently, a photoresist 17 is applied. Then, a photolithography step is performed so that windows are formed in the P-type source 4, the N-type drain 5, and the P-type diffused layer 16 (FIG. 2C).

However, the prior art method of fabricating MIS transistors needs both a photolithography step for implanting N-type impurity ions and a photolithography step for implanting P-type impurity ions. Furthermore, both patterns are out of register from each other. Therefore, contact with both N-type and P-type diffused layers must be made with one contact hole (so-called batting contact). The problem is that the size of the batting contact must be increased.

SUMMARY OF THE INVENTION

Accordingly, in the present invention a photolithography step is carried out so that windows are formed in the N-type diffused layer. An N-type impurity is introduced by ion implantation. Then, a thermal oxidation step is carried out to enhance only the N-type diffused layer. Using the resulting oxide film as a mask, a P-type impurity is introduced by ion implantation.

The number of the photolithography steps which has been heretofore two can be reduced down to one by the means described thus far. Furthermore, the N-type and P-type diffused layers can be formed by self-aligned techniques. Consequently, the batting contact size can be made small.

BRIEF DESCRIPTION OF THE DRAWINGS

FIG. 3 is a diagram illustrating the relation between enhanced oxide film thickness and the dose of As;

FIGS. 5A–B are cross-sectional views at LOCOS end;

FIG. 6 is a plan view of a batting contact of a second example of the invention;

Figure 1A:
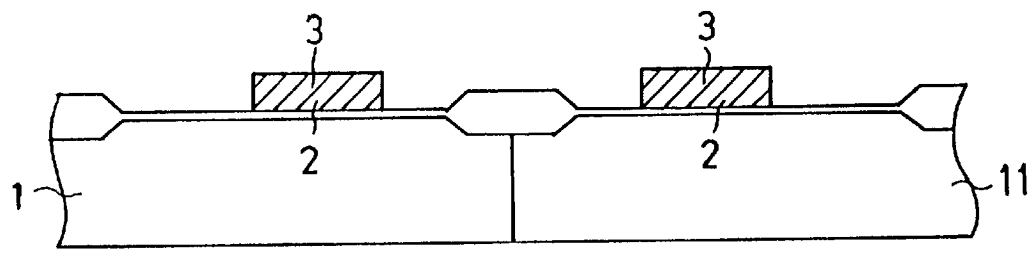
FIGS. 1A–D are cross-sectional views illustrating a process sequence for MIS transistor of a first example of the present invention.

DETAILED DESCRIPTION OF THE PREFERRED EMBODIMENTS (1) First Example

MIS transistors according to the present invention and a method of fabricating them are illustrated in FIG. 1. FIG. 1D is a cross-sectional view of the MIS transistors according to the present invention. A gate-insulating film 2 is formed on the surface of an N-type semiconductor substrate 1 and on the surface of a P-type semiconductor substrate 11. Gate electrodes 3 are formed on the film 2. A P-type source 4, a P-type drain 5, an N-type source 14, and an N-type drain 15 are formed close to the surfaces of the semiconductor substrates 1 and 11 adjacently to the gate electrodes 3. An N-type diffused layer 6 for contact with the substrate and a P-type diffused layer 16 are formed close to them. An oxide film 8 is formed over the P-type source 4, the P-type drain 5, and the P-type diffused layer 16. An oxide film 18 is formed over the N-type source 14, the N-type drain 15, and the N-type diffused layer 6. The P-type source 4 is located in a self-aligned relation to the N-type diffused layer 6. Similarly, the N-type source 14 is located in a self-aligned relation to the P-type diffused layer 16. The surfaces of the P-type source 4, the P-type drain 5, and the P-type diffused layer 16 are higher than the surfaces of the N-type source 14, the N-type drain 15, and the N-type diffused layer 6 by more than 30 nm.

Figure 1B:
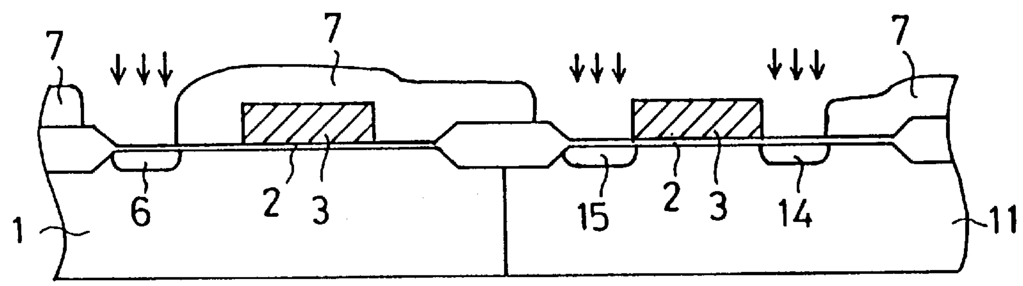
Figure 1C:
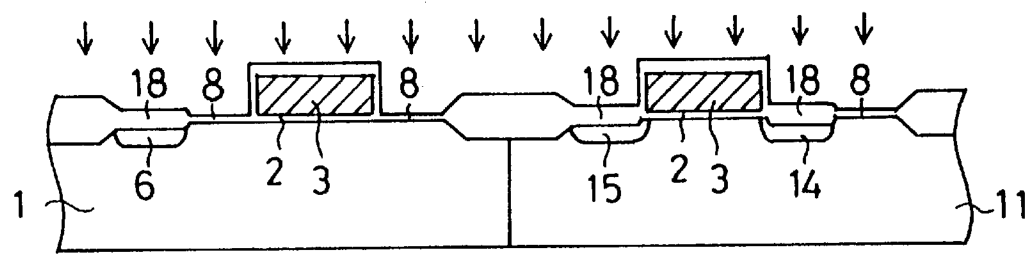
Figure 3:
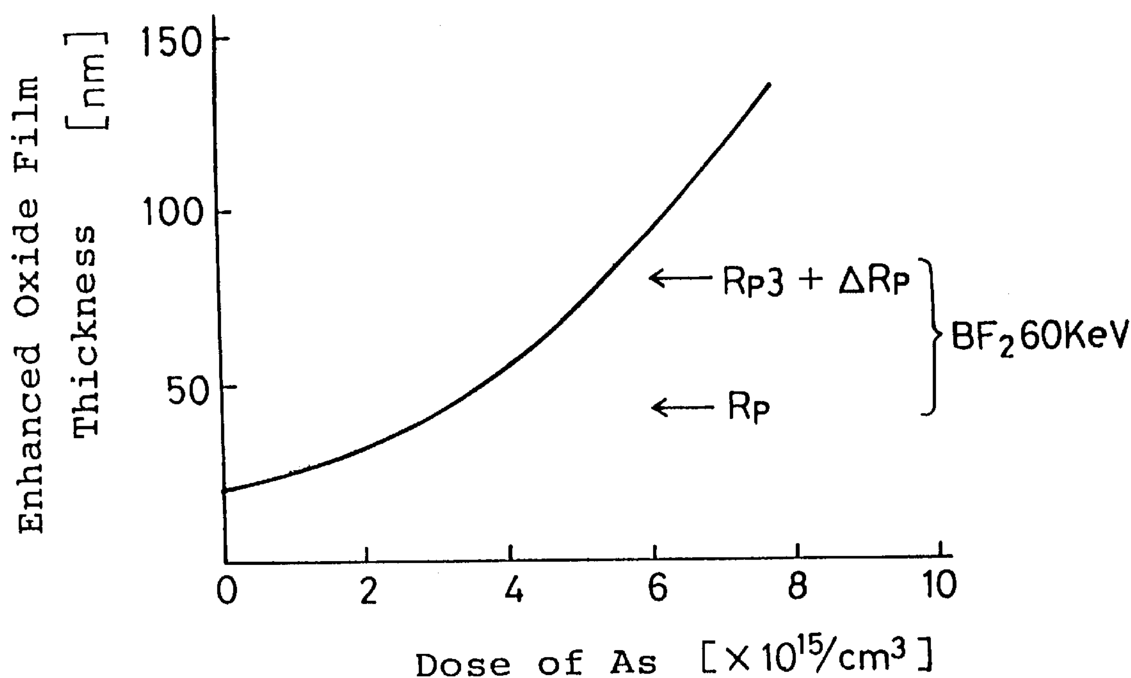

A manufacturing method is next described. A gate-insulating film 2 is formed on the surfaces of an N-type semiconductor substrate 1 and a P-type semiconductor substrate 11. Gate electrodes 3 are formed on the film 2 (FIG. 1A). A photoresist 7 is applied. Thereafter, a photolithography step is performed so that windows are formed in the N-type source 14, the N-type drain 15, and the N-type diffused layer 6. Arsenic (as) is introduced by ion implantation under the condition 5 to $8\times10^{15}/cm^2$ (FIG. 1B). Subsequently, a heat treatment is carried out above 900° C. A thermal oxidation step is performed under a wet ambient below 850° C. An oxide film 8 is obtained on regions becoming the P-type source 4, the P-type drain 5, and the P-type diffused layer 16. At the same time, only the N-type source 14, the N-type drain 15, and the N-type diffused layer 6 are oxidized by enhanced thermal oxidation, thus obtaining the enhanced oxide film 18 over them (FIG. 1C). If a heat treatment above 900° C. is not performed, the PN junction at the LOCOS end becomes leaky, for the reason described below. As is $7\times10^{15}/cm^2$. An anneal is performed within $N_2$ at 950° C. A wet oxidation step is carried out at 800° C. The thickness of the oxide film overlying the regions implanted with As is 120 nm. The thickness of the oxide film overlying the regions not implanted with As is 20 nm. The relation between the enhanced oxide film and the dose of As is illustrated in FIG. 3. As the enhanced oxide film thickness is increased, the dose is increased.

Figure 1D:
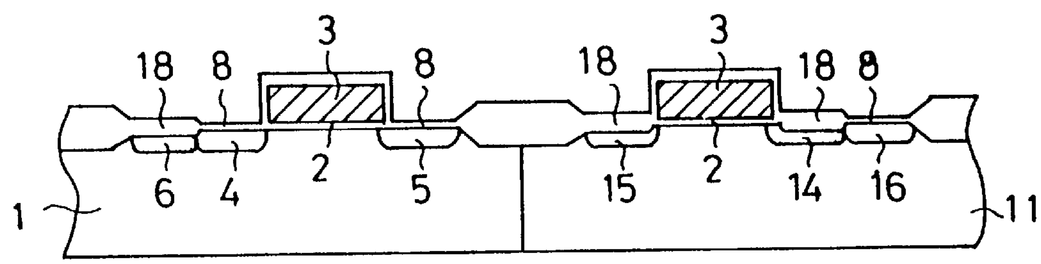
Figure 2A:
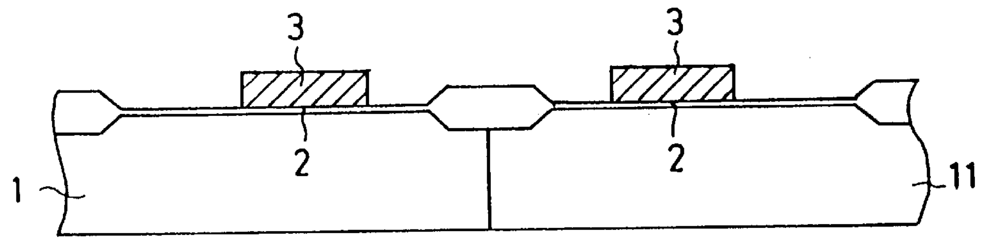
FIGS. 2A–D are cross-sectional views illustrating a process sequence for MIS transistor according to the prior art techniques.
Figure 2B:
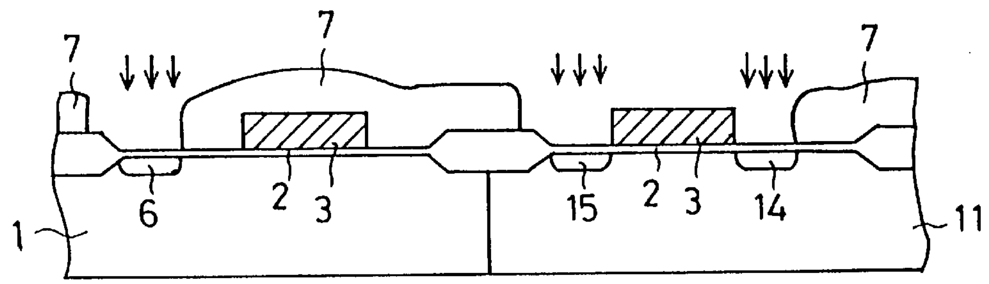
Figure 2C:
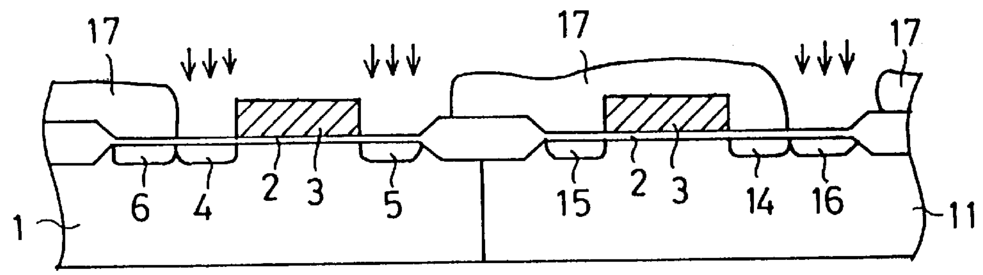
Figure 2D:
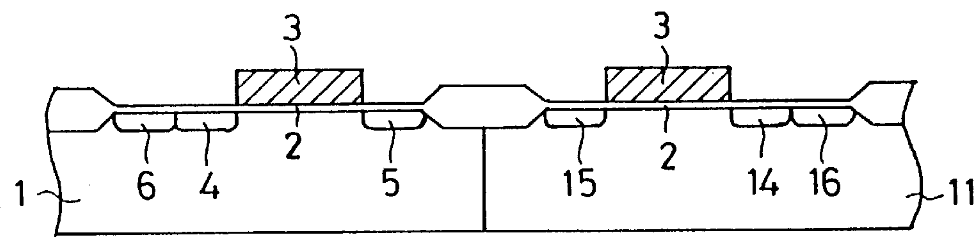

Then, B ions or $BF_2$ ions are implanted by making use of the difference between these two oxide film thicknesses (FIG. 1D). The conditions are that a projection range Rp and its standard deviation ΔRp satisfy the relations:

(1)Rp> thickness of oxide film of portions not implanted with As; and (2)Rp+3ΔRp< thickness of enhanced oxide film over regions implanted with As.

Figure 4:
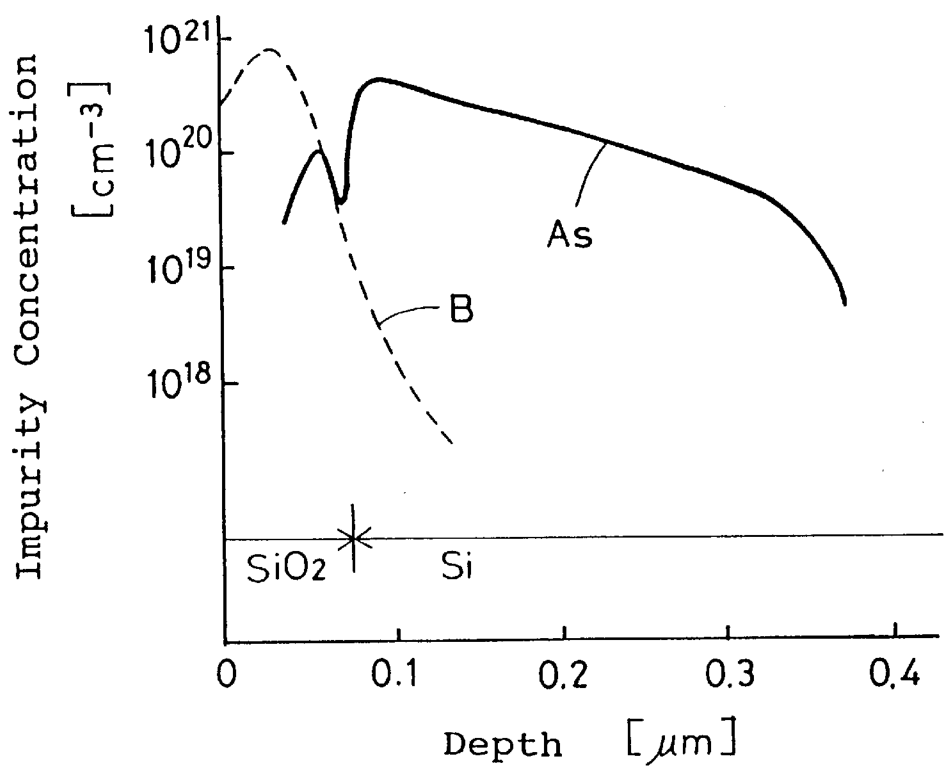
FIG. 4 illustrates the SIM profile of As and B in the direction of depth.

Under these conditions, the B or $BF_2$ does not reach the regions of the semiconductor substrate implanted with As but reaches the regions of the semiconductor substrate not implanted with As. One example of the conditions is that $BF_2$, 60 KeV, and $3.5\times10^{15}/cm^2$. Rp and Rp +3ΔRp used at this time are illustrated in FIG. 3. It can be seen that the relations among these, the thickness of the oxide film over the regions implanted with As and the thickness of the oxide film of the regions not implanted with As satisfy the above-described inequalities. The SIMS profiles of As and B in the direction of depth after activation are shown in FIG. 4. Almost all the B is present inside the enhanced oxide film. The concentration of As at the surface of the Si substrate is in excess of $5\times10^{19}$ atoms/$cm^3$. In FIG. 4, it is the N type with a concentration exceeding $10^{20}$ atoms/$cm^3$. As described thus far, the P-type source 4, the P-type drain 5, and the P-type diffused layer 16 can be formed in a self-aligned relation with the N-type diffused layer and without performing any photolithography step. In this example, As is used for $N^+$. It is also possible to use P.

The necessity of the heat treatment above 900° C. is described now. Where no heat treatment is carried out, enhanced oxidation does not take place at the LOCOS end.

Therefore, in the cross section of the LOCOS end, portions of oxide film 8 not enhanced are formed between the field oxide film 20 and the enhanced oxide film 18, as shown in FIG. 5B. As a result, B or $BF_2$ penetrates through them, forming an $N^+/P^+$ junction. Consequently, a junction leakage due to zener breakdown occurs. If a heat treatment is effected above 900° C., the cross section at the LOCOS end takes the form shown in FIG. 5A. The result is that the $N^+/P^+$ junction is not formed. Where $N^+$is created with P, this heat treatment is not necessary.

(2) Second Example

FIG. 6 is an example of a batting contact according to the present invention. An N-type source 14 and an N-type drain 15 are formed on opposite sides of a gate electrode 3. A P-type diffused layer 16 is formed adjacently to the N-type source 14 on the opposite side of the gate electrode 3. With respect to the N-type source 14 and the P-type diffused layer 16, electrodes are taken with one batting contact 19. The fabrication method is similar to the first example. The N-type source 14 and the N-type drain 15 are formed by photolithography and ion implantation. A thermal oxidation step is carried out in a wet ambient below 850° C. Then, P-type impurity ions are implanted into the whole surface, thus forming a P-type diffused layer 16. Therefore, the positional relation between the N-type source 14 and the P-type diffused layer 16 is self-aligning.

In the past, implantation of an N-type impurity, implantation of a P-type impurity, and photolithography of contacts have been aligned to an active area and so the size of the batting contact is required to be about three times as large as the normal contact size, taking account of all of these misalignments. In the present second example, however, both N-type source 14 and P-type diffused layer 16 can be formed by self-aligned techniques and, therefore, it is only necessary that the size of the batting contact be about twice as large as the normal contact size. The example of the N-channel MIS transistor has been described thus far. The same principle applies to the P-channel type.

(3) Third Example

Figure 7A:
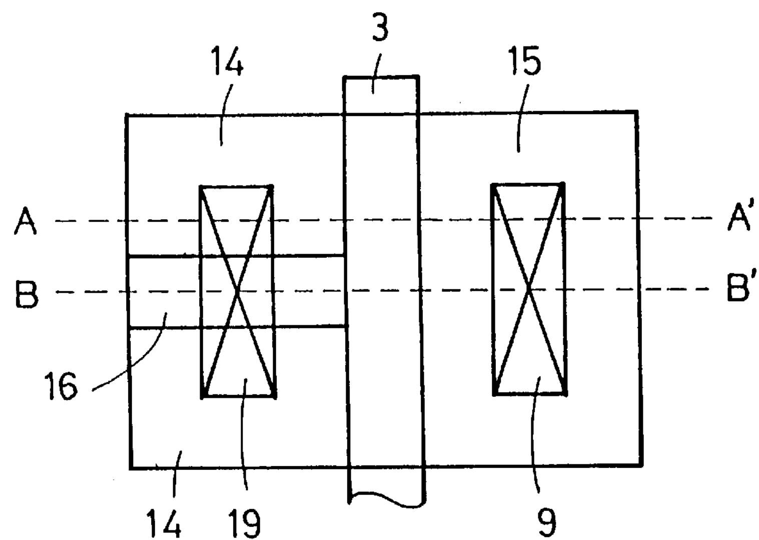
FIGS. 7A–C are plan views and cross-sectional views of a SOIMIS transistor according to a third example of the invention.
Figure 7B:
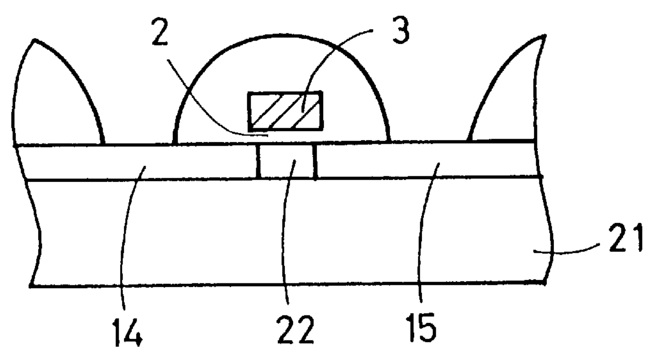
Figure 7C:
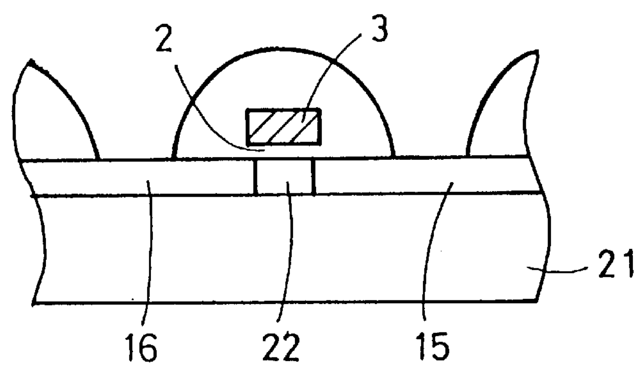

An example in which the present invention is applied to MIS transistors using an SOI substrate is a third example. In the SOI, each individual transistor is completely isolated from each other and so each transistor always needs substrate contact. Therefore, the size of batting contact is of importance. N-channel MIS transistors are taken as an example. Its plan view is shown in FIG. 7A. An N-type drain 15 is formed on one side of a gate electrode 3. Formed on the other side are N-type sources 14 which are located on opposite sides of a central P-type diffused layer 16. One batting contact 19 is open over the P-type diffused layer 16 and the N-type source 14. FIG. 7B is a cross section taken on A–A'. FIG. 7C is a cross section taken on B–B'. A channel 22 is formed inside a semiconductor layer over an insulating substrate 21. In the case of the cross section taken on A–A', the N-type source 14 and the N-type drain 15 are formed on opposite sides of the channel. In the case of the cross section taken on B–B', the P-type diffused layer 16 for taking the potential on the channel 22 and the N-type drain 15 are formed on opposite sides of the channel. The manufacturing method is similar to the method of the first example.

(4) Fourth Example

FIG. 8 illustrates MIS transistors with homopolar gates according to the invention and a method of fabricating them. FIG. 8B is a cross-sectional view. A gate-insulating film 2 is formed on the surfaces of an N-type semiconductor substrate 1 and of a P-type semiconductor substrate 11. A P-type gate electrode 3 is formed on the gate-insulating film 2 overlying the N-type semiconductor substrate 1. An N-type gate electrode 13 is formed on the gate-insulating film 2 overlying the P-type semiconductor substrate 11. The structures of the source, the drain, and the diffused layers for substrate contact are the same as those of the first example.

Figure 8A:
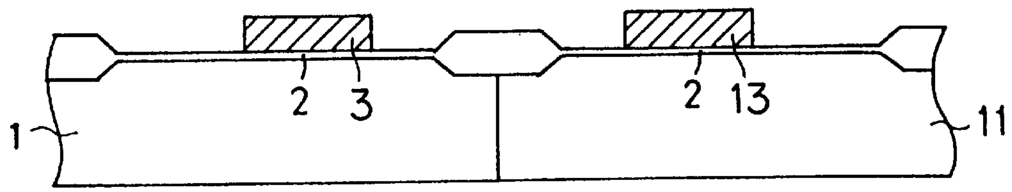
FIGS. 8A–D are cross-sectional views of MIS transistor with homopolar gate of a fourth example of the invention.
Figure 8B:
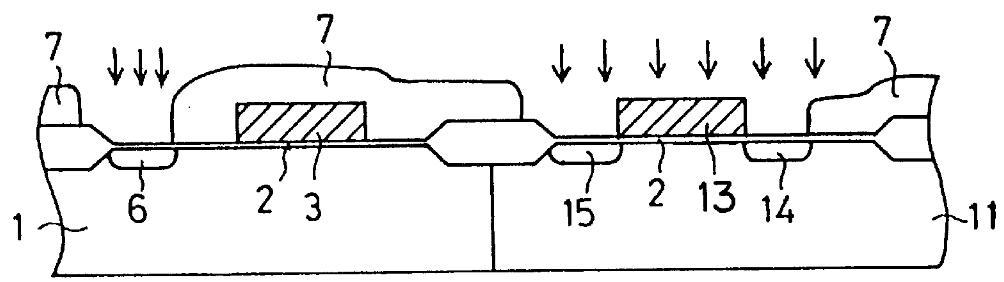
Figure 8C:
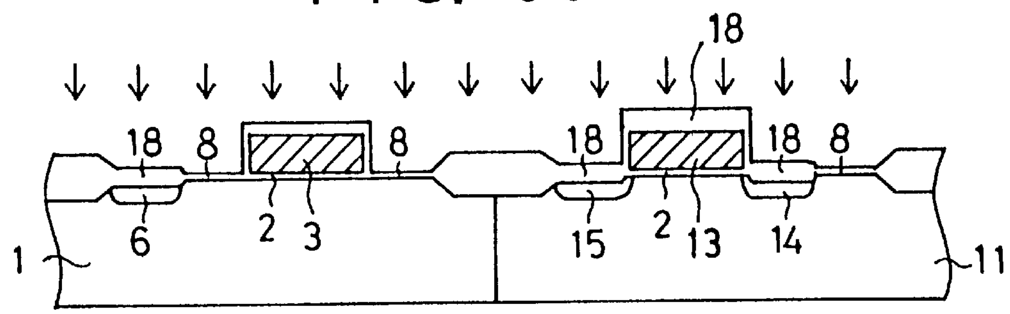
Figure 8D:
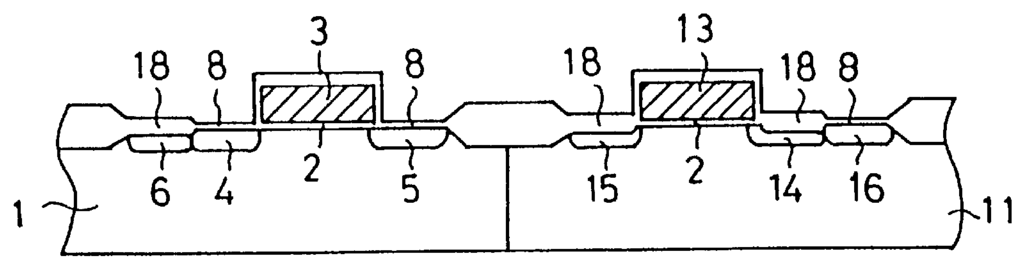

The manufacturing method is next described. The gate-insulating film 2 is formed on the surfaces of the N-type semiconductor substrate 1 and of the P-type semiconductor substrate 11. Undoped polysilicon becoming a gate electrode is patterned on the film 2 (FIG. 8A). A photoresist 7 is applied and then a photolithography step is performed so that windows are formed in the N-type gate electrode 13, the N-type source 14, the N-type drain 15, and the N-type diffused layer 6. An N-type impurity is introduced by ion implantation (FIG. 8B). Subsequent steps and conditions are similar to those used in the first example. However, the enhanced oxide film 18 is also formed over the N-type gate electrode 13 (FIG. 8C). Therefore, the undoped polysilicon on the gate-insulating film 2 over the N-type semiconductor substrate 1 is made to become the P-type gate electrode 3 by subsequently implanting P-type ions into the whole surface (FIG. 8D).

The present invention has solved the problems with the prior art techniques, i.e., two photolithography steps and large batting contact size. The invention can supply MIS transistors having N- and P-type diffused layers capable of being formed by self-aligned techniques in one photolithography step, as well as its manufacturing method.

What is claimed is:

1. A MIS transistor comprising:

a semiconductor substrate having an N-type conductivity;

a source region and a drain region disposed in the semiconductor substrate in spaced-apart relation from one another, the source region and the drain region being first diffused regions having a P-type conductivity;

an insulating film disposed on the semiconductor substrate;

a gate electrode disposed on the insulating film between the source region and the drain region;

a second diffused region having an N-type conductivity disposed in the semiconductor substrate and in contact with the source region; and an oxide film formed on the second diffused region by enhanced thermal oxidation.

2. A MIS transistor as claimed in claim 1; wherein a surface of the semiconductor substrate in the second diffused region is lower than the surface of the semiconductor substrate in the first diffused regions.

3. A MIS transistor as claimed in claim 2; wherein the surface of the semiconductor substrate in the second diffused region is lower than the surface of the semiconductor substrate in the first diffused regions by more than 30 nm.

4. A MIS transistor comprising: a semiconductor substrate having a P-type conductivity; first diffused regions disposed in the semiconductor substrate and having an N-type conductivity; a second diffused region disposed in the semiconductor substrate and in contact with one of the first diffused regions, the second diffused region having a P-type conductivity; an insulating film disposed on the surface of the semiconductor substrate; an oxide film formed on the first diffused regions by enhanced thermal oxidation; and a gate electrode disposed on the insulating film between the first diffused regions; wherein the surface of the semiconductor substrate in the first diffused regions is lower than the surface of the semiconductor substrate in the second diffused region.

5. A MIS transistor as claimed in claim 4; wherein the first diffused regions comprise source and drain regions, the second diffused region being in contact with the source region.

6. A MIS transistor as claimed in claim 4; wherein the first diffused regions comprise source and drain regions, the second diffused region being in contact with the source region.

7. A semiconductor device comprising:

a first semiconductor substrate having a first conductivity type;

a pair of first diffused regions disposed in the first semiconductor substrate and having a second conductivity type;

a second diffused region disposed in the first semiconductor substrate and having the first conductivity type, the second diffused region being in contact with one of the first diffused regions;

a second semiconductor substrate having the second conductivity type;

a pair of third diffused regions disposed in the second semiconductor substrate and having the first conductivity type;

a fourth diffused region disposed in the second semiconductor substrate and having the second conductivity type, the fourth diffused region being in contact with one of the third diffused regions;

an insulating film disposed on a surface of the first semiconductor substrate and on a surface of the second semiconductor substrate;

a first gate electrode disposed on the insulating film between the first diffused regions;

a second gate electrode disposed on the insulating film between the third diffusion regions; and an oxide film formed on the second diffused region and on the third diffused regions by enhanced thermal oxidation.

8. A MIS transistor as claimed in claim 7; wherein the first diffused regions and the fourth diffused region comprise P-type diffusion regions, and the second diffused region and the third diffused regions comprise N-type diffusion regions; and wherein the surface of the semiconductor substrate in the N-type diffusion regions is lower than the surface of the semiconductor substrate in the P-type diffusion regions.

9. A MIS transistor as claimed in claim 8; wherein the first diffused regions comprise source and drain regions, the second diffused region being in contact with the source region.

10. A MIS transistor as claimed in claim 8; wherein the third diffused regions comprise source and drain regions, the fourth diffused region being in contact with the source region.

* * * * *